(12) United States Patent
Todd

(10) Patent No.: US 7,547,615 B2
(45) Date of Patent: Jun. 16, 2009

(54) DEPOSITION OVER MIXED SUBSTRATES USING TRISILANE

(75) Inventor: Michael A. Todd, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 11/843,552

(22) Filed: Aug. 22, 2007

(65) Prior Publication Data

US 2008/0014725 A1 Jan. 17, 2008

Related U.S. Application Data

(60) Division of application No. 10/918,547, filed on Aug. 12, 2004, now Pat. No. 7,273,799, which is a continuation of application No. 10/074,633, filed on Feb. 11, 2002, now Pat. No. 6,900,115.

(60) Provisional application No. 60/268,337, filed on Feb. 12, 2001, provisional application No. 60/279,256, filed on Mar. 27, 2001, provisional application No. 60/311,609, filed on Aug. 9, 2001, provisional application No. 60/323,649, filed on Sep. 19, 2001, provisional application No. 60/332,696, filed on Nov. 13, 2001, provisional application No. 60/333,724, filed on Nov. 28, 2001, provisional application No. 60/340,454, filed on Dec. 7, 2001.

(51) Int. Cl.
*H01L 21/20* (2006.01)

(52) U.S. Cl. .................. 438/483; 438/478; 438/482

(58) Field of Classification Search .................. 438/478, 438/482, 483

See application file for complete search history.

(56) References Cited

U.S. PATENT DOCUMENTS

| 3,900,597 | A | 8/1975 | Chruma et al. |
| 4,118,539 | A | 10/1978 | Hirai et al. |
| 4,200,666 | A | 4/1980 | Reinberg |
| 4,217,374 | A | 8/1980 | Ovshinsky et al. |
| 4,237,150 | A | 12/1980 | Wiesmann |
| 4,363,828 | A | 12/1982 | Brodsky et al. |
| 4,379,020 | A | 4/1983 | Glaeser et al. |
| 4,444,812 | A | 4/1984 | Gutsche |

(Continued)

FOREIGN PATENT DOCUMENTS

EP 0368651 A2 5/1990

(Continued)

OTHER PUBLICATIONS

Ikoma et al., "Growth of Si/3C-SiC/Si(100) hetrostructures by pulsed supersonic free jets," *Applied Physics Letters*, vol. 75, No. 25, pp. 3977-3979 (1999).

(Continued)

*Primary Examiner*—Long Pham
(74) *Attorney, Agent, or Firm*—Knobbe, Martens Olson & Bear, LLP

(57) ABSTRACT

Trisilane is used in chemical vapor deposition methods to deposit silicon-containing films over mixed substrates. Such methods are useful in semiconductor manufacturing to provide a variety of advantages, including uniform deposition over heterogeneous surfaces, high deposition rates, and higher manufacturing productivity. An example is in forming the base region of a heterojunction bipolar transistor, including simultaneous deposition over both single crystal semiconductor surfaces and amorphous insulating regions.

11 Claims, 9 Drawing Sheets

U.S. PATENT DOCUMENTS

| | | |
|---|---|---|
| 4,452,875 A | 6/1984 | Ogawa et al. |
| 4,481,229 A | 11/1984 | Suzuki et al. |
| 4,495,218 A | 1/1985 | Azuma et al. |
| 4,557,794 A | 12/1985 | McGinn et al. |
| 4,578,142 A | 3/1986 | Corboy, Jr. et al. |
| 4,585,671 A | 4/1986 | Kitagawa et al. |
| 4,592,933 A | 6/1986 | Meyerson et al. |
| 4,615,762 A | 10/1986 | Jastrzebski et al. |
| 4,631,804 A | 12/1986 | Roy |
| 4,634,605 A | 1/1987 | Wiesmann |
| 4,684,542 A | 8/1987 | Jasinski et al. |
| 4,695,331 A | 9/1987 | Ramaprasad |
| 4,707,197 A | 11/1987 | Hensel et al. |
| 4,720,395 A | 1/1988 | Foster |
| 4,737,379 A | 4/1988 | Hudgens et al. |
| 4,745,088 A | 5/1988 | Inoue et al. |
| 4,755,481 A | 7/1988 | Faraone |
| 4,854,263 A | 8/1989 | Chang et al. |
| 4,871,416 A | 10/1989 | Fukuda |
| 4,891,092 A | 1/1990 | Jastrzebski |
| 4,894,352 A | 1/1990 | Lane et al. |
| 4,933,206 A | 6/1990 | Cox |
| 4,963,506 A | 10/1990 | Liaw et al. |
| 4,966,861 A | 10/1990 | Mieno et al. |
| 4,992,299 A | 2/1991 | Hochberg et al. |
| 5,037,666 A | 8/1991 | Mori |
| 5,080,933 A | 1/1992 | Grupen-Shemansky et al. |
| 5,082,696 A | 1/1992 | Sharp |
| 5,091,761 A | 2/1992 | Hiraiwa et al. |
| 5,110,757 A | 5/1992 | Arst et al. |
| 5,112,773 A | 5/1992 | Tuttle |
| 5,192,714 A | 3/1993 | Suguro et al. |
| 5,194,398 A | 3/1993 | Miyachi et al. |
| 5,198,387 A | 3/1993 | Tang |
| 5,214,002 A | 5/1993 | Hayashi et al. |
| 5,227,329 A | 7/1993 | Kobayashi et al. |
| 5,231,056 A | 7/1993 | Sandhu |
| 5,234,609 A | 8/1993 | Kashida et al. |
| 5,242,847 A | 9/1993 | Ozturk et al. |
| 5,250,452 A | 10/1993 | Ozturk et al. |
| 5,324,684 A | 6/1994 | Kermani et al. |
| 5,326,649 A | 7/1994 | Kashida et al. |
| 5,356,821 A | 10/1994 | Naruse et al. |
| 5,385,863 A | 1/1995 | Tatsumi et al. |
| 5,389,398 A | 2/1995 | Suzuki et al. |
| 5,389,570 A | 2/1995 | Shiozawa |
| 5,453,858 A | 9/1995 | Yamazaki |
| 5,461,250 A | 10/1995 | Burghartz et al. |
| 5,471,330 A | 11/1995 | Sarma |
| 5,504,704 A | 4/1996 | Sato et al. |
| 5,508,067 A | 4/1996 | Sato et al. |
| 5,510,146 A | 4/1996 | Miyasaka |
| 5,540,785 A | 7/1996 | Dennard et al. |
| 5,563,093 A | 10/1996 | Koda et al. |
| 5,587,344 A | 12/1996 | Ishikawa |
| 5,591,494 A | 1/1997 | Sato et al. |
| 5,607,724 A | 3/1997 | Beinglass et al. |
| 5,614,257 A | 3/1997 | Beinglass et al. |
| 5,616,754 A | 4/1997 | Cruse et al. |
| 5,648,293 A | 7/1997 | Hayama et al. |
| 5,654,237 A | 8/1997 | Suguro et al. |
| 5,656,531 A | 8/1997 | Thakur et al. |
| 5,677,236 A | 10/1997 | Saitoh et al. |
| 5,695,819 A | 12/1997 | Beinglass et al. |
| 5,698,771 A | 12/1997 | Shields et al. |
| 5,700,520 A | 12/1997 | Beinglass et al. |
| 5,731,238 A | 3/1998 | Cavins et al. |
| 5,763,021 A | 6/1998 | Young et al. |
| 5,786,027 A | 7/1998 | Rolfson |
| 5,789,030 A | 8/1998 | Rolfson |
| 5,837,580 A | 11/1998 | Thakur et al. |
| 5,849,601 A | 12/1998 | Yamazaki |
| 5,863,598 A | 1/1999 | Venkatesan et al. |
| 5,869,389 A | 2/1999 | Ping et al. |
| 5,874,129 A | 2/1999 | Beinglass et al. |
| 5,876,797 A | 3/1999 | Beinglass et al. |
| 5,879,970 A | 3/1999 | Shiota et al. |
| 5,885,869 A | 3/1999 | Turner et al. |
| 5,893,949 A | 4/1999 | King et al. |
| 5,930,106 A | 7/1999 | DeBoer et al. |
| 5,959,326 A | 9/1999 | Aiso et al. |
| 5,998,289 A | 12/1999 | Sagnes |
| 6,013,922 A | 1/2000 | Ueda et al. |
| 6,027,705 A | 2/2000 | Kitsuno et al. |
| 6,027,975 A | 2/2000 | Hergenrother et al. |
| 6,083,810 A | 7/2000 | Obeng et al. |
| 6,090,666 A | 7/2000 | Ueda et al. |
| 6,103,600 A | 8/2000 | Ueda et al. |
| 6,107,147 A | 8/2000 | Kim et al. |
| 6,121,081 A | 9/2000 | Thakur et al. |
| 6,153,541 A | 11/2000 | Yao et al. |
| 6,159,828 A | 12/2000 | Ping et al. |
| 6,161,498 A | 12/2000 | Toraguchi et al. |
| 6,162,667 A | 12/2000 | Funai et al. |
| 6,171,662 B1 | 1/2001 | Nakao |
| 6,197,669 B1 | 3/2001 | Twu et al. |
| 6,197,694 B1 | 3/2001 | Beinglass |
| 6,210,988 B1 | 4/2001 | Howe et al. |
| 6,228,181 B1 | 5/2001 | Yamamoto et al. |
| 6,235,568 B1 | 5/2001 | Murthy et al. |
| 6,252,284 B1 | 6/2001 | Muller et al. |
| 6,252,295 B1 | 6/2001 | Cote et al. |
| 6,274,463 B1 | 8/2001 | Chaiken |
| 6,281,559 B1 | 8/2001 | Yu et al. |
| 6,284,583 B1 | 9/2001 | Saido et al. |
| 6,319,782 B1 | 11/2001 | Nakabayashi et al. |
| 6,326,064 B1 | 12/2001 | Denison et al. |
| 6,326,311 B1 | 12/2001 | Ueda et al. |
| 6,346,732 B1 | 2/2002 | Mizushima et al. |
| 6,365,465 B1 | 4/2002 | Chan et al. |
| 6,365,479 B1 | 4/2002 | U'Ren |
| 6,372,559 B1 | 4/2002 | Crowder et al. |
| 6,373,112 B1 | 4/2002 | Murthy et al. |
| 6,385,020 B1 | 5/2002 | Shin et al. |
| 6,444,512 B1 | 9/2002 | Madhukar et al. |
| 6,455,892 B1 | 9/2002 | Okuno et al. |
| 6,465,045 B1 | 10/2002 | Heuer et al. |
| 6,610,361 B1 | 8/2003 | Heuer et al. |
| 6,613,695 B2 | 9/2003 | Pomarede et al. |
| 6,709,512 B2 | 3/2004 | Yamoto et al. |
| 6,716,751 B2 | 4/2004 | Todd |
| 6,743,738 B2 | 6/2004 | Todd |
| 6,821,825 B2 | 11/2004 | Todd et al. |
| 6,900,115 B2 | 5/2005 | Todd |
| 6,958,253 B2 | 10/2005 | Todd |
| 6,962,859 B2 | 11/2005 | Todd et al. |
| 7,005,160 B2 | 2/2006 | Todd |
| 7,026,219 B2 | 4/2006 | Pomarede et al. |
| 7,186,582 B2 | 3/2007 | Todd |
| 7,186,630 B2 | 3/2007 | Todd |
| 7,273,799 B2 | 9/2007 | Todd |
| 7,285,500 B2 | 10/2007 | Todd |
| 2002/0011612 A1 | 1/2002 | Heida |
| 2002/0016084 A1 | 2/2002 | Todd |
| 2002/0036290 A1 | 3/2002 | Inaba et al. |
| 2002/0098627 A1 | 7/2002 | Pomarede et al. |
| 2002/0168868 A1 | 11/2002 | Todd |
| 2002/0173130 A1 | 11/2002 | Pomerede et al. |
| 2004/0115953 A1 | 6/2004 | Yamazaki et al. |
| 2005/0064684 A1 | 3/2005 | Todd et al. |
| 2005/0233529 A1 | 10/2005 | Pomarede et al. |
| 2006/0130743 A1 | 6/2006 | Brabant et al. |
| 2007/0102790 A1 | 5/2007 | Todd |
| 2007/0117359 A1 | 5/2007 | Todd |

| | | | | | |
|---|---|---|---|---|---|
| 2008/0073645 | A1 | 3/2008 | Todd et al. | | |

| | | | | | |
|---|---|---|---|---|---|
| KR | | 10-0209856 | | 7/1999 | |
| WO | | WO 99/35311 | | 7/1999 | |
| WO | | WO 00/03425 | | 1/2000 | |
| WO | | WO 00/13227 | | 3/2000 | |
| WO | | WO 02/064853 | | 8/2002 | |
| WO | | WO 02/065508 | | 8/2002 | |
| WO | | WO 02/065516 | | 8/2002 | |
| WO | | WO 02/065517 | | 8/2002 | |
| WO | | WO 02/065525 | | 8/2002 | |
| WO | | WO 02/080244 | | 10/2002 | |

FOREIGN PATENT DOCUMENTS

| | | | |
|---|---|---|---|
| EP | 0486047 | A2 | 5/1992 |
| EP | 0747974 | A2 | 11/1996 |
| EP | 1065728 | A2 | 3/2001 |
| GB | 2332564 | A | 6/1999 |
| JP | 57209810 | A | 12/1982 |
| JP | 59078918 | A | 5/1984 |
| JP | 59078919 | A | 5/1984 |
| JP | 1985-015967 | | 1/1985 |
| JP | 60043485 | A | 3/1985 |
| JP | S60-43485 | | 3/1985 |
| JP | 61153277 | A | 7/1986 |
| JP | 1986-194823 | | 8/1986 |
| JP | 62076612 | A | 4/1987 |
| JP | 63003414 | A | 1/1988 |
| JP | 63003463 | A | 1/1988 |
| JP | 1988-051680 | | 3/1988 |
| JP | 01217956 | A | 8/1989 |
| JP | 01268064 | A | 10/1989 |
| JP | 02155225 | A | 6/1990 |
| JP | H 02-155225 | | 6/1990 |
| JP | 03091239 | A | 4/1991 |
| JP | H3-91239 | | 4/1991 |
| JP | 03185817 | A | 8/1991 |
| JP | 03187215 | A | 8/1991 |
| JP | H3-185817 | | 8/1991 |
| JP | H3-187215 | | 8/1991 |
| JP | 03292741 | A | 12/1991 |
| JP | 04323834 | A | 11/1992 |
| JP | 05021378 | A | 1/1993 |
| JP | 05062911 | A | 3/1993 |
| JP | H5-62911 | | 3/1993 |
| JP | 1993-275335 | | 10/1993 |
| JP | 1993-087171 | | 12/1993 |
| JP | 1994-013313 | | 1/1994 |
| JP | 1994-310493 | | 11/1994 |
| JP | 1995-037823 | | 2/1995 |
| JP | 1995-131007 | | 5/1995 |
| JP | 07249618 | A | 9/1995 |
| JP | 1996-078335 | | 3/1996 |
| JP | 1996-148427 | | 6/1996 |
| JP | 08242006 | A | 9/1996 |
| JP | 1996-298333 | | 11/1996 |
| JP | 1997-153633 | | 6/1997 |
| JP | 1997-260293 | | 10/1997 |
| JP | 10-203895 | | 8/1998 |
| JP | 10-308503 | | 11/1998 |
| JP | 1998-321860 | | 12/1998 |
| JP | 1999-087341 | | 3/1999 |
| JP | 1999-238809 | | 8/1999 |
| JP | 1999-326958 | | 11/1999 |
| JP | 11317530 | | 11/1999 |
| JP | 2000-232219 | | 8/2000 |
| JP | 2000-323420 | | 11/2000 |
| JP | 2000-340512 | | 12/2000 |
| JP | 2000-340684 | | 12/2000 |
| JP | 2001-007301 | | 1/2001 |
| JP | 2001-015736 | | 1/2001 |
| KR | 1999-029923 | | 4/1999 |

OTHER PUBLICATIONS

Olivares et al., "Solid-phase crystallization of amorphous SiGe films deposited by LPCVD on $SiO_2$ and glass," *Thin Solid Films* 337 pp. 51-54 (1999).

Van Zant, "Microchip Fabrication," 4th Ed., McGraw Hill, New York, pp. 364-365 (2000).

Van Zant, "Microchip Fabrication," 4th Ed., McGraw Hill, New York, pp. 380-382 (2000).

Van Zant, "Microchip Fabrication," 4th Ed., McGraw Hill, New York, pp. 385 (2000).

Van Zant, "Microchip Fabrication," 4th Ed., McGraw Hill, New York, pp. 522-526 (2000).

Bensahel et al., "Industrial single wafer processing of in-situ doped polycrsyalline Si and $Si_{1-x}Ge_x$," *Solid State Technology*, Mar. 1998, pp. S5-S10.

Wolf, S. and Tauber, R., "Silicon Processing for the VLSI Era," vol. 1, Lattice Press, Sunset Beach, CA, p. 176 (2000).

Wong, H.S., "Beyond the Conventional Transistor," IBM J. Res. & Dev., vol. 46, No. 2/3, p. 133-168, Mar./May 2002.

Office Action in U.S. Appl. No. 10/074,722 mailed Feb. 14, 2003.
Office Action in U.S. Appl. No. 10/074,722 mailed Jun. 30, 2003.
Final Office Action in U.S. Appl. No. 10/074,722 mailed Dec. 4, 2003.
Office Action in U.S. Appl. No. 10/074,722 mailed May 3, 2004.
Final Office Action in U.S. Appl. No. 10/074,722 mailed Oct. 5, 2004.
Office Action in U.S. Appl. No. 10/918,547 mailed Dec. 5, 2006.
Office Action in U.S. Appl. No. 10/074,564 mailed Sep. 25, 2003.
Final Office Action in U.S. Appl. No. 10/074,564 mailed Jan. 25, 2005.
Office Action in U.S. Appl. No. 10/074,534 mailed Mar. 28, 2003.
Final Office Action in U.S. Appl. No. 10/074,534 mailed Jul. 8, 2003.
Office Action in U.S. Appl. No. 10/074,534 mailed Mar. 25, 2004.
Office Action in U.S. Appl. No. 10/074,534 mailed Oct. 4, 2004.
Office Action in U.S. Appl. No. 11/124,340 mailed Jun. 28, 2006.
Office Action in U.S. Appl. No. 11/642,167 mailed Oct. 2, 2008.
Office Action in U.S. Appl. No. 10/219,687 mailed Nov. 19, 2003.
Final Office Action in U.S. Appl. No. 10/219,687 mailed Aug. 11, 2004.
Office Action in U.S. Appl. No. 10/219,687 mailed Jan. 13, 2005.
Final Office Action in U.S. Appl. No. 10/219,687 mailed Oct. 19, 2005.
Office Action in U.S. Appl. No. 10/219,687 mailed Feb. 13, 2006.
Final Office Action in U.S. Appl. No. 10/219,687 mailed Jul. 18, 2006.
Office Action in U.S. Appl. No. 10/424,207 mailed Dec. 16, 2004.
Office Action in U.S. Appl. No. 11/626,730 mailed Feb. 6, 2008.
Final Office Action in U.S. Appl. No. 11/626,730 mailed Sep. 5, 2008.
Office Action in U.S. Appl. No. 11/343,244 mailed Aug. 5, 2008.
Office Action in U.S. Appl. No. 11/343,244 mailed Nov. 26, 2008.

SEM Photomicrograph of Si-Ge Film Deposited Using Silane and Germane

SEM Photomicrograph of Si-Ge Film Deposited Using Silane and Germane

SEM Photomicrograph of Si-Ge Film Deposited Using Trisilane and Germane

SEM Photomicrograph of Si-Ge Film Deposited Using Trisilane and Germane

DEPOSITION OVER MIXED SUBSTRATES USING TRISILANE

RELATED APPLICATION INFORMATION

This application is a divisional of U.S. application Ser. No. 10/918,547, filed Aug. 12, 2004, which is a continuation of U.S. application Ser. No. 10/074,633, filed Feb. 11, 2002, now U.S. Pat. No. 6,900,115, issued May 31, 2005, which claims priority to U.S. Provisional Application No. 60/268,337, filed Feb. 12, 2001; U.S. Provisional Application No. 60/279,256, filed Mar. 27, 2001; U.S. Provisional Application No. 60/311,609, filed Aug. 9, 2001; U.S. Provisional Application No. 60/323,649, filed Sep. 19, 2001; U.S. Provisional Application No. 60/332,696, filed Nov. 13, 2001; U.S. Provisional Application No. 60/333,724, filed Nov. 28, 2001; and U.S. Provisional Application No. 60/340,454, filed Dec. 7, 2001.

BACKGROUND OF THE INVENTION

1. Field of the Invention

This application relates generally to the deposition of silicon-containing materials, and more particularly to chemical vapor deposition of silicon-containing films over mixed substrates.

2. Description of the Related Art

A variety of methods are used in the semiconductor manufacturing industry to deposit materials onto surfaces. For example, one of the most widely used methods is chemical vapor deposition ("CVD"), in which atoms or molecules contained in a vapor deposit on a surface and build up to form a film. Deposition of silicon-containing ("Si-containing") materials using conventional silicon sources and deposition methods is believed to proceed in several distinct stages, see Peter Van Zant, "Microchip Fabrication," $4^{th}$ Ed., McGraw Hill, New York, (2000), pp. 364-365. Nucleation, the first stage, is very important and is greatly affected by the nature and quality of the substrate surface. Nucleation occurs as the first few atoms or molecules deposit onto the surface and form nuclei. During the second stage, the isolated nuclei form small islands that grow into larger islands. In the third stage, the growing islands begin coalescing into a continuous film. At this point, the film typically has a thickness of a few hundred angstroms and is known as a "transition" film. It generally has chemical and physical properties that are different from the thicker bulk film that begins to grow after the transition film is formed.

Deposition processes are usually designed to produce a particular type of bulk film morphology, e.g., epitaxial, polycrystalline or amorphous. When using conventional silicon sources and deposition processes, nucleation is very important and critically dependent on substrate quality. For example, attempting to grow a single-crystal film on a wafer with islands of unremoved oxide will result in regions of polysilicon in the bulk film. Because of these nucleation issues, deposition of thin film Si-containing materials with similar physical properties onto substrates having two or more different types of surfaces using conventional silicon sources and deposition methods is often problematic.

For example, silicon tetrachloride ($SiCl_4$), silane ($SiH_4$), and dichlorosilane ($SiH_2Cl_2$) are the most widely used silicon sources in the semiconductor manufacturing industry for depositing Si-containing films, see Peter Van Zant, "Microchip Fabrication," $4^{th}$ Ed., McGraw Hill, New York, (2000), p 380-382. However, deposition using these conventional silicon sources is generally difficult to control over mixed substrates, such as surfaces containing both single crystal silicon and silicon dioxide. Control is difficult because the morphology and thickness of the resulting Si-containing film depend on both the deposition temperature and the morphology of the underlying substrate. Other deposition parameters, including total reactor pressure, reactant partial pressure and reactant flow rate can also strongly influence the quality of depositions over mixed substrates.

For example, FIG. 1A schematically illustrates a cross-section of a substrate 100 having an exposed silicon dioxide ("oxide") surface 110 and an exposed single crystal silicon surface 120. FIGS. 1B and 1C schematically illustrate the results obtained by using silane in a chemical vapor deposition process to deposit a silicon film onto the substrate 100. For temperatures of about 625° C. and below, deposition conditions can be selected that result in a low defectivity, epitaxial silicon film 130 over the epitaxial surface 120, but under such conditions no film (FIG. 1B) or a film 140 having poor quality (FIG. 1C) is deposited over the oxide surface 110. The differences in film formation are believed to be a result of the differences in nucleation rates on the two surfaces when silane is used as the silicon source. Conventional silicon precursors demonstrate well-documented poor nucleation over dielectrics, such as silicon oxide. By the time spotty nucleation sites converge on the oxide, deposition over adjacent non-dielectric regions has progressed considerably. Furthermore, deposition tends to be rough over the dielectric since widely spread nucleation sites support deposition while regions between remain bare. Often, the illustrated "selective" epitaxial deposition is desired (FIG. 1B); in other cases, better deposition of silicon over the oxide surface 110 is desired, e.g., to facilitate later contact to the epitaxial region.

In theory, the deposition parameters could be adjusted to improve the film formation over the oxide surface, but in practice this is rarely an option because such an adjustment would be likely to negatively impact the desired epitaxial film quality. In many cases, the desired performance characteristics of the resulting semiconductor device dictate the thickness, morphology, temperature of deposition and allowable deposition rate of the Si-containing film that is deposited over the epitaxial surface. The needed thickness and morphology, in turn, dictate the deposition conditions for the film. This is especially the case for heteroepitaxial films that are strained on single crystal silicon substrates. Therefore, the manufacturer generally has little freedom to adjust the conditions to alter the characteristics of the film over the oxide surface. Similar problems are also encountered in situations involving other mixed substrates.

In the past, manufacturers have approached such problems through the use of selective deposition or additional masking and/or process steps. For example, U.S. Pat. No. 6,235,568 notes that one is presently unable to selectively deposit a silicon film onto p-type and n-type silicon surfaces at the same time. U.S. Pat. No. 6,235,568 purports to provide a solution to this problem by carrying out a pre-deposition low energy blanket ion implantation step. The stated purpose of this additional step is to make the surfaces appear the same to a subsequent deposition process.

However, additional process steps are generally undesirable because they may increase expense, contamination and/or complication. The ability to deposit satisfactory mixed morphology Si-containing films over mixed substrates would satisfy a long-felt need and represent a significant advance in the art of semiconductor manufacturing.

SUMMARY OF THE INVENTION

Methods have now been discovered that utilize trisilane to deposit high quality Si-containing films over a variety of substrates. In accordance with one aspect of the invention, a deposition method is provided, comprising:

providing a substrate disposed within a chamber, wherein the substrate comprises a first surface having a first surface morphology and a second surface having a second surface morphology different from the first surface morphology;

introducing trisilane to the chamber under chemical vapor deposition conditions; and depositing a Si-containing film onto the substrate over both of the first surface and the second surface.

In accordance with another aspect of the invention, a high-rate deposition method is provided, comprising:

delivering trisilane to a mixed substrate surface under chemical vapor deposition conditions, at a delivery rate of at least about 0.001 milligrams per minute per square centimeter of the mixed substrate surface, and depositing a silicon-containing material onto the mixed substrate surface at a rate of about 10 Å per minute or greater.

In another aspect of the invention, a method for making a base structure for a heterojunction biplar transistor (HBT) is provided, comprising:

providing a substrate surface comprising an active area and an insulator; and supplying trisilane to the substrate surface under conditions effective to deposit a Si-containing film onto the substrate directly onto each of the active area and the insulator.

In another preferred embodiment, a method for reducing the number of steps in a semiconductor device manufacturing process is provided, comprising:

identifying a semiconductor device manufacturing process that comprises (a) depositing a first silicon-containing film onto a non-epitaxial surface using a first silicon source and, in a separate step, (b) depositing a second silicon-containing film onto an epitaxial surface using a second silicon source; wherein the first silicon source and the second silicon source are each individually selected from the group consisting of silane, disilane, dichlorosilane, trichlorosilane and silicon tetrachloride; and modifying the semiconductor device manufacturing process by replacing the first silicon source and the second silicon source with trisilane and simultaneously depositing a third silicon-containing film onto the epitaxial surface and the non-epitaxial surface in the same step.

These and other aspects of the invention will be better understood in view of the preferred embodiments, described in greater detail below.

DETAILED DESCRIPTION OF THE PREFERRED EMBODIMENTS

Figure 1B:
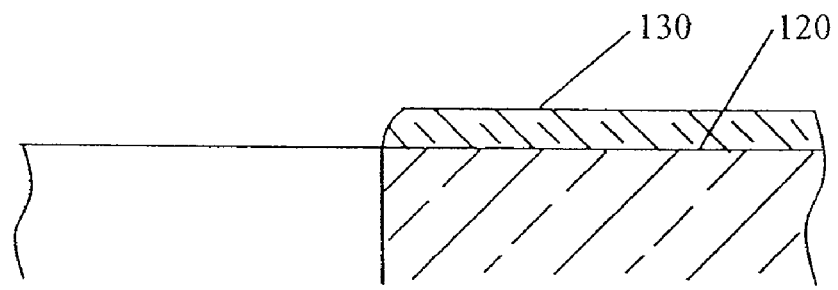
Figure 1C:
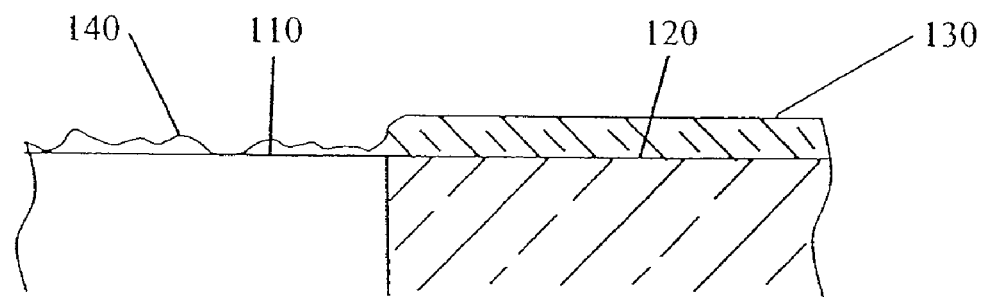
Figure 2A:
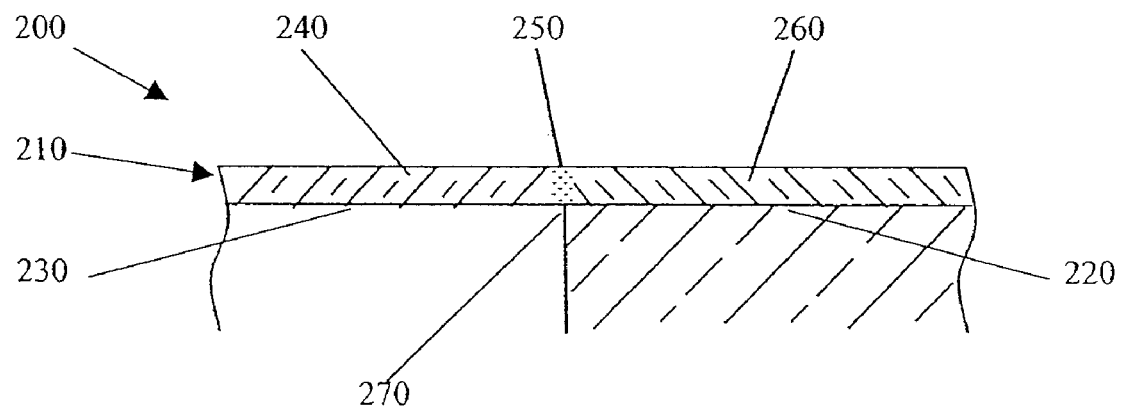
FIGS. 2A and 2B are schematic cross sections illustrating deposition over a mixed substrate using trisilane, in accordance with a preferred embodiment.
Figure 2B:
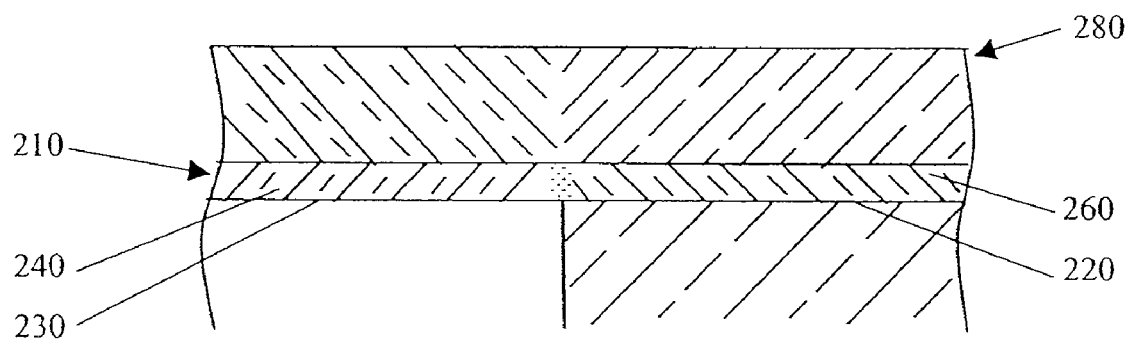

Deposition processes have now been discovered that are much less sensitive to nucleation phenomena. These processes employ trisilane ($H_3SiSiH_2SiH_3$) to enable the deposition of high quality Si-containing films over mixed substrates. FIG. 2A schematically illustrates a preferred structure 200 resulting from such a deposition process. Compared to FIG. 1B, successful deposition of a Si-containing film 210 over both types of substrate surface (the single crystal, semiconductor surface 220 and the dielectric surface 230) while maintaining epitaxial crystal quality and a close match in total deposited thickness can be achieved using trisilane. FIGS. 2A and 2B are described in more detail below.

As used herein, a "mixed substrate" is a substrate that has two or more different types of surfaces. There are various ways that surfaces can be different from each other. For example, the surfaces can be made from different elements such as copper or silicon, or from different metals, such as copper or aluminum, or from different Si-containing materials, such as silicon or silicon dioxide. Even if the materials are made from the same element, the surfaces can be different if the morphologies of the surfaces are different. The electrical properties of surfaces can also make them different from each other. In the illustrated examples, silicon-containing layers are simultaneously formed over conductive semiconductive materials and dielectrics. Examples of dielectric materials include silicon dioxide, silicon nitride, metal oxide, and metal silicate.

The processes described herein are useful for depositing Si-containing films on a variety of mixed substrates, but are particularly useful for substrates having mixed surface morphologies. Such a mixed substrate comprises a first surface having a first surface morphology and a second surface having a second surface morphology. In this context, "surface morphology" refers to the crystalline structure of the substrate surface. Amorphous and crystalline are examples of different morphologies. Polycrystalline morphology is a crystalline structure that consists of a disorderly arrangement of orderly crystals and thus has an intermediate degree of order. The atoms in a polycrystalline material have long range order within each of the crystals, but the crystals themselves lack long range order with respect to one another. Single crystal morphology is a crystalline structure that has a high degree of order. Epitaxial films are characterized by a crystal structure and orientation that is identical to the substrate upon which they are grown. The atoms in these materials are arranged in a lattice-like structure that persists over relatively long distances (on an atomic scale). Amorphous morphology is a non-crystalline structure having a low degree of order because the atoms lack a definite periodic arrangement. Other morphologies include microcrystalline and mixtures of amorphous and crystalline material.

Figure 1A:
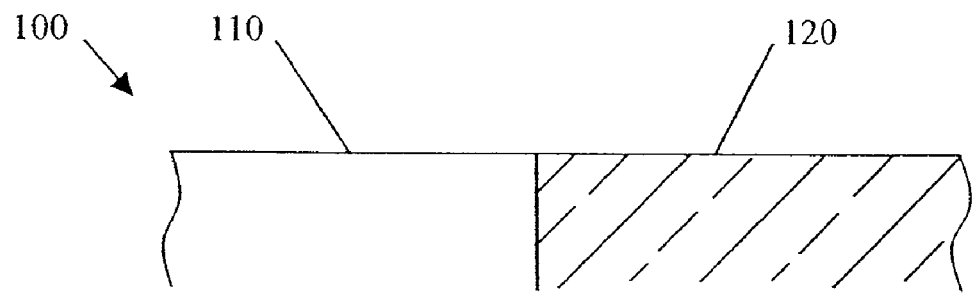
FIG. 1A to 1C are schematic cross sections illustrating problems encountered in prior art deposition methods onto a mixed substrate.
Figure 3A:
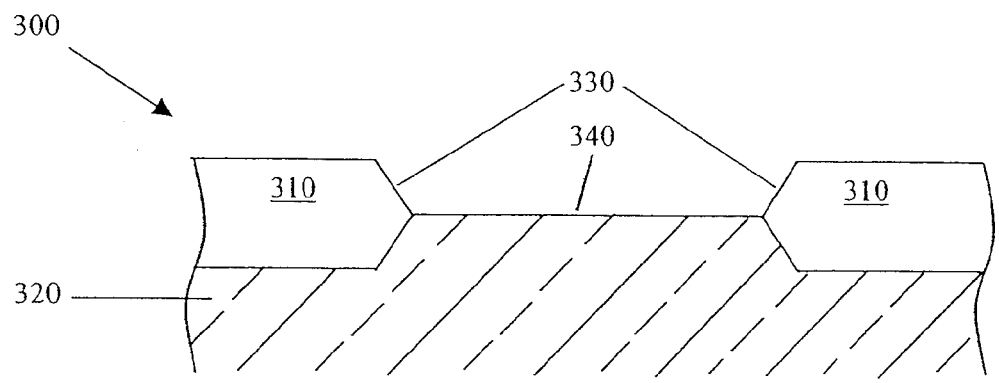
FIG. 3A to 3C of the invention illustrates deposition over a mixed substrate, including a window between field oxide regions, using trisilane in accordance with a preferred embodiment.

Specific examples of mixed substrates are shown in FIGS. 1A (discussed above) and 3A. FIG. 3A illustrates a substrate 300 having field isolation regions 310 over a semiconductor substrate 320. Preferably, the semiconductor substrate 320 is a single crystal wafer, (or an epitaxial silicon layer deposited over such a wafer) and the isolation regions 310 are silicon dioxide. In the illustrated embodiment, the substrate 300 comprises a first substrate surface having a semiconductor active area 340 having a single crystal surface morphology and a second substrate surface 330 having an amorphous surface morphology. The silicon active area 340 and the surface of the isolation regions 330 are morphologically different (crystalline vs. amorphous) and have different electrical conductivity (conductor vs. insulator). Those skilled in the art will appreciate a variety of methods for making such a structure 300, including local oxidation of silicon (LOCOS) and trench isolation processes, see Peter Van Zant, "Microchip Fabrication," $4^{th}$ Ed., McGraw Hill, New York, (2000), pp. 522-526.

Under the CVD conditions taught herein, the delivery of trisilane to the surface of a mixed substrate results in the formation of a Si-containing film. Preferably, delivery of the trisilane to the mixed or patterned substrate surface is accomplished by introducing the trisilane to a suitable chamber having the mixed substrate disposed therein. By establishing CVD conditions in the chamber and supplying trisilane to the mixed substrate surface, a high quality Si-containing film can be deposited onto the mixed substrate over the various surface types. Deposition may be suitably conducted according to the various CVD methods known to those skilled in the art, but the greatest benefits are obtained when deposition is conducted according to the CVD methods taught herein. The disclosed methods may be suitably practiced by employing CVD, including plasma-enhanced chemical vapor deposition (PECVD) or thermal CVD, utilizing gaseous trisilane to deposit a Si-containing film onto a mixed substrate contained within a CVD chamber. Thermal CVD is preferred.

Thermal CVD is preferably conducted at a substrate temperature of about 400° C. or greater, more preferably about 450° C. or greater, even more preferably about 500° C. or greater. Preferably, deposition takes place at a temperature of about 750° C. or less, more preferably about 725° C. or less, most preferably about 700° C. or less. The substrate can be heated by a variety of manners known in the art. Those skilled in the art can adjust these temperature ranges to take into account the realities of actual manufacturing, e.g., preservation of thermal budget, deposition rate, etc. Preferred deposition temperatures thus depend on the desired application, but are typically in the range of about 400° C. to about 750° C., preferably about 425° C. to about 725° C., more preferably about 450° C. to about 700° C.

Trisilane is preferably introduced to the chamber in the form of a gas or as a component of a feed gas. The total pressure in the CVD chamber is preferably in the range of about 0.001 torr to about 1000 torr, more preferably in the range of about 0.1 torr to about 850 torr, most preferably in the range of about 1 torr to about 760 torr. The partial pressure of trisilane is preferably in the range of about 0.0001% to about 100% of the total pressure, more preferably about 0.001% to about 50% of the total pressure. The feed gas can include a gas or gases other than trisilane, such as inert carrier gases. Hydrogen and nitrogen are preferred carrier gases for the methods described herein. Preferably, trisilane is introduced to the chamber by way of a bubbler used with a carrier gas to entrain trisilane vapor, more preferably a temperature controlled bubbler.

A suitable manifold may be used to supply feed gas(es) to the CVD chamber. In the illustrated embodiments, the gas flow in the CVD chamber is horizontal, most preferably the chamber is a single-wafer, single pass, laminar horizontal gas flow reactor, preferably radiantly heated. Suitable reactors of this type are commercially available, and preferred models include the Epsilon™ series of single wafer reactors commercially available from ASM America, Inc. of Phoenix, Ariz. While the methods described herein can also be employed in alternative reactors, such as a showerhead arrangement, benefits in increased uniformity and deposition rates have been found particularly effective in the horizontal, single-pass laminar gas flow arrangement of the Epsilon™ chambers, employing a rotating substrate, particularly with low process gas residence times. CVD may be conducted by introducing plasma products (in situ or downstream of a remote plasma generator) to the chamber, but thermal CVD is preferred.

The feed gas may also contain other materials known by those skilled in the art to be useful for doping or alloying Si-containing films, as desired. Preferably the gas further comprises of one or more precursors selected from the group consisting of germanium source, carbon source, boron source, gallium source, indium source, arsenic source, phosphorous source, antimony source, nitrogen source and oxygen source. Specific examples of such sources include: silane, disilane and tetrasilane as silicon sources; germane, digermane and trigermane as germanium sources; $NF_3$, ammonia, hydrazine and atomic nitrogen as nitrogen sources; various hydrocarbons, e.g., methane, ethane, propane, etc. as carbon sources; monosilylmethane, disilylmethane, trisilylmethane, and tetrasilylmethane as sources of both carbon and silicon; $N_2O$ and $NO_2$ as sources of both nitrogen and oxygen; and various dopant precursors as sources of dopants such as antimony, arsenic, boron, gallium, indium and phosphorous.

Incorporation of dopants into Si-containing films by CVD using trisilane is preferably accomplished by in situ doping using dopant precursors. Precursors for electrical dopants include diborane, deuterated diborane, phosphine, arsenic vapor, and arsine. Silylphosphines $[(H_3Si)_{3-x}PR_x]$ and silylarsines $[(H_3Si)_{3-x}AsR_x]$ where x=0-2 and $R_x$=H and/or D are preferred precursors for phosphorous and arsenic dopants. $SbH_3$ and trimethylindium are preferred sources of antimony and indium, respectively. Such dopant precursors are useful for the preparation of preferred films as described below, preferably boron-, phosphorous-, antimony-, indium-, and arsenic-doped silicon, SiC, SiGe and SiGeC films and alloys. As used herein, "SiC", "SiGe", and "SiGeC" represent materials that contain the indicated elements in various proportions. For example, "SiGe" is a material that comprises silicon, germanium and, optionally, other elements, e.g., dopants. "SiC", "SiGe", and "SiGeC" are not chemical stoichiometric formulas per se and thus are not limited to materials that contain particular ratios of the indicated elements.

The amount of dopant precursor in the feed gas may be adjusted to provide the desired level of dopant in the Si-containing film. Typical concentrations in the feed gas can be in the range of about 1 part per billion (ppb) to about 1% by weight based on total feed gas weight, although higher or lower amounts are sometimes preferred in order to achieve the desired property in the resulting film. In the preferred Epsilon™ series of single wafer reactors, dilute mixtures of dopant precursor in a carrier gas can be delivered to the reactor via a mass flow controller with set points ranging from about 10 to about 200 standard cubic centimeters per minute (sccm), depending on desired dopant concentration and dopant gas concentration. The dilute mixture is preferably further diluted by mixing with trisilane and any suitable carrier gas. Since typical total flow rates for deposition in the preferred Epsilon™ series reactors often range from about 20 standard liters per minute (slm) to about 180 slm, the concentration of the dopant precursor used in such a method is small relative to total flow.

Deposition of the Si-containing films described herein is preferably conducted at a rate of about 5 Å per minute or higher, more preferably about 10 Å per minute or higher, most preferably about 20 Å per minute or higher. A preferred embodiment provides a high rate deposition method in which trisilane is delivered to the mixed substrate surface at a delivery rate of at least about 0.001 milligram per minute per square centimeter of the substrate surface, more preferably at least about 0.003 milligram per minute per square centimeter of the substrate surface. Under CVD conditions, preferably at a deposition temperature in the range of about 450° C. to about 700° C., practice of this embodiment results in relatively fast deposition of the Si-containing material (as compared to other silicon sources), preferably at a rate of about 10 Å per minute or higher, more preferably about 25 Å per minute or higher, most preferably about 50 Å per minute or higher. Preferably, a germanium source is also delivered to the surface along with the trisilane to thereby deposit a SiGe-containing material as the Si-containing material.

In a preferred embodiment, a mixed-morphology Si-containing film is deposited onto the mixed substrate. A "mixed-morphology," as used herein, film is a film that comprises two or more different morphologies in different lateral regions of the substrate. FIG. 2A illustrates such a mixed morphology silicon film 210. The film 210 comprises a non-epitaxial region 240 deposited over the amorphous oxide surface 230 and an epitaxial region 260 deposited over the single crystal surface 220. In the illustrated embodiment, the film 210 also includes a boundary region 250 that is deposited over the boundary 270 between the oxide surface 230 and the single crystal surface 220.

The morphologies of the mixed-morphology film depend on the deposition temperature, pressure, reactant partial pressure(s) and reactant flow rates and the surface morphologies of the underlying substrate. Using trisilane, silicon-containing materials capable of forming single crystal films tend to form over properly prepared single crystal surfaces, whereas non-single crystal films tend to form over non-single crystalline surfaces. Epitaxial film formation is favored for silicon-containing materials capable of forming pseudomorphic structures when the underlying single crystal surface has been properly treated, e.g., by ex-situ wet etching of any oxide layers followed by in situ cleaning and/or hydrogen bake steps, and when the growth conditions support such film growth. Such treatment methods are known to those skilled in the art, see Peter Van Zant, "Microchip Fabrication," 4$^{th}$ Ed., McGraw Hill, New York, (2000), pp. 385. Polycrystalline and amorphous film formation is favored over amorphous and polycrystalline surfaces and over single crystal surfaces that have not been treated to enable epitaxial film growth. Amorphous film formation is favored over amorphous and polycrystalline substrate surfaces at low temperatures, while polycrystalline films tend to form over amorphous and polycrystalline surfaces at relatively high deposition temperatures.

In the illustrated embodiment shown in FIG. 2A, the single crystal surface 220 was previously prepared (not shown in FIG. 2A) for epitaxial deposition by etching with HF acid to remove the native oxide, rinsing with ultra-pure water and drying under an ultra-pure inert gas, followed by baking under a flow of ultra-pure hydrogen gas. Having rendered the single crystal surface 220 an active area suitable for epitaxial deposition, the mixed-morphology silicon film 210 is then deposited at a temperature of about 575° C. by delivering trisilane to the single crystal surface 220 and to the amorphous surface 230. At this deposition temperature, an epitaxial region 260 is deposited over the single crystal surface 220 and an amorphous silicon region 240 is deposited over the amorphous surface 230. Although the surfaces 220 and 230 are schematically illustrated as coplanar, the disclosed deposition methods are also applicable to mixed substrates in which the different surfaces are non-coplanar.

Trisilane is preferably delivered to the mixed substrate surface for a period of time and at a delivery rate that is effective to form a Si-containing film having the desired thickness. Film thickness over a particular surface can range from about 10 Å to about 10 microns or even more, depending on the application. Preferably, the thickness of the Si-containing film over any particular surface is in the range of about 50 Å to about 5,000 Å, more preferably about 250 Å to about 2,500 Å.

For a mixed substrate comprising a first surface having a first surface morphology and a second surface having a second surface morphology, the Si-containing film deposited onto this mixed substrate preferably has a thickness $T_1$ over the first surface and a thickness $T_2$ over the second surface such that $T_1:T_2$ is in the range of about 10:1 to about 1:10, more preferably about 5:1 to about 1:5, even more preferably about 2.:1 to about 1:2, and most preferably about 1.3:1 to about 1:1.3. Surprisingly, trisilane deposition under the CVD conditions described herein tends to produce a Si-containing film having a thickness that is approximately proportional to deposition time and relatively independent of underlying surface morphology. More particularly, trisilane enables rapid nucleation and smooth film formation over dielectric surfaces, as compared to conventional silicon precursors. Compare FIGS. 6 and 7 to FIGS. 8 and 9, discussed below. Thus, under preferred deposition conditions, the nucleation time tends to be very short on a broad variety of surfaces, and $T_1:T_2$ is preferably about 1:1.

In a preferred embodiment, the Si-containing film is a buffer layer having a thickness of about 1,000 Å or less, preferably a thickness in the range of about 10 Å to about 500 Å, more preferably in the range of about 50 Å to about 300 Å. In this context, a "buffer layer" is a Si-containing film that is deposited onto a substrate for the purpose of facilitating the deposition of a subsequent layer or protecting an underlying layer. When the buffer layer is used for the purpose of facilitating nucleation, it may also be referred to as a nucleation layer. The thickness ranges described above refer to deposition over the entire mixed substrate, e.g., over both the crystalline and amorphous surfaces.

For example, the Si-containing film 210 in FIG. 2B is a buffer layer because it facilitates the subsequent deposition of an overlying film 280. In the illustrated embodiment, the film 280 is a silicon germanium-containing ("SiGe-containing") material such as SiGe or SiGeC. Preferably, the overlying film 280 is a mixed morphology film having an epitaxial morphology over the epitaxial region 260 and a non-single crystal morphology over the non-single crystal region 240.

For the purpose of describing the buffer layer 210 in FIG. 2B, it is assumed that the deposition of the overlying film 280 onto the mixed substrate (having a single crystal silicon surface 220 and an amorphous oxide surface 230 as shown in FIG. 2A) is problematic because nucleation on the oxide surface 230 is difficult under conditions that favor low-defectivity single crystal growth over the single crystal surface 220 at temperatures of about 650° C. and below (see, e.g., FIG. 1B and the discussion above). Such difficulties may be encountered, for example, when attempting to deposit a SiGe film using a mixture of a conventional silicon source such as silane and a germanium source such as germane. The buffer layer 210 improves the deposition of the overlying film 280 (relative to direct deposition onto the single crystal surface 220 and the oxide surface 230) even though the region 240 is polycrystalline and the region 260 is single crystal, since no oxide is exposed at this stage. In the illustrated embodiment, the buffer layer 210 is an arsenic-doped silicon film deposited using trisilane and trisilylarsine (about 50 parts per million (ppm), based on total) at a deposition temperature of about 600° C. The region 260 is preferably epitaxial, and the region 240 is preferably amorphous or polycrystalline, to facilitate SiGe deposition as discussed below.

In addition to achieving deposition per se over both types of surfaces, it is also usually desirable for the deposited film to have a uniform elemental composition over both surfaces. For example, the relative amounts of silicon and germanium in the overlying film 280 are preferably relatively constant across the film, over both the region 240 and the region 260. However, in addition to the problem of different deposition rates over the two underlying surfaces, the composition of the deposited film also tends to vary when using conventional silicon and germanium sources. For example, when silane and germane are used to deposit a SiGe film directly onto a mixed substrate, both the thickness and the composition of the resulting film varies considerably over underlying mixed surfaces.

Use of a buffer layer is particularly helpful in situations such as this, where the film being deposited contains two or more elements, because deposition onto a buffer layer preferably produces a film that is more uniform in both thickness and composition. Even using conventional sources of silicon and germanium for depositing over the buffer layer 210 in FIG. 2B preferably produces a SiGe film 280 having a more uniform composition over both of the underlying single crystal and amorphous substrate surfaces 220 and 230 than would be achieved in the absence of the buffer layer.

In a preferred embodiment, trisilane is used in a method for making a base structure for a bipolar transistor. The method for making the base structure comprises providing a substrate surface that comprises an active area and an insulator and supplying trisilane to the substrate surface under conditions effective to deposit a silicon-containing film onto the substrate over both the active area and the insulator.

In a preferred embodiment, the Si-containing film is deposited onto the mixed substrate in the form of a SiGe-containing film, preferably a SiGe or a SiGeC film, comprising from about 0.1 atomic % to about 80 atomic % germanium, preferably about 1 atomic % to about 60 atomic %. The SiGe-containing film is preferably deposited by simultaneously introducing a germanium source and trisilane to the chamber, more preferably by using a mixture of trisilane and a germanium source. The SiGe-containing film may be deposited onto a buffer layer as described above, preferably onto a silicon or doped silicon buffer layer, or directly onto the mixed substrate. More preferably, the germanium source is germane or digermane. The relative proportions of elements in the film, e.g., silicon, germanium, carbon, dopants, etc., are preferably controlled by varying the feed gas composition as discussed above. The germanium concentration may be constant through the thickness of the film or a graded film can be produced by varying the concentration of the germanium source in the feed gas during the deposition.

A preferred gas mixture for the deposition of SiGe comprises a hydrogen carrier gas, germane or digermane as the germanium source, and trisilane. The weight ratio of trisilane to germanium source in the feed gas is preferably in the range of about 10:90 to about 99:1, more preferably about 20:80 to about 95:5. To achieve preferred high rate deposition as described above, the germanium source is preferably delivered to the mixed substrate at a delivery rate of at least about 0.001 milligrams per minute per square centimeter of the mixed substrate surface, more preferably at least about 0.003 milligrams per minute per square centimeter of the mixed substrate surface. The delivery rate of the germanium source is preferably adjusted in concert with the delivery rate of trisilane to achieve the desired deposition rate and film composition. Preferably, the delivery rate of the germanium source is varied to produce a graded germanium concentration SiGe or SiGeC film.

Preferably, the surface morphology and composition of at least one surface of the underlying mixed substrate is effective to allow strained heteroepitaxial growth of SiGe films thereon. A "heteroepitaxial" deposited layer is an epitaxial film that has a different composition than the single crystal substrate onto which it is deposited. A deposited epitaxial layer is "strained" when it is constrained to have a lattice structure in at least two dimensions that is the same as that of the underlying single crystal substrate, but different from its inherent lattice constant. Lattice strain is present because the atoms depart from the positions that they would normally occupy in the lattice structure of the free-standing, bulk material when the film deposits in such a way that its lattice structure matches that of the underlying single crystal substrate.

CVD using trisilane and a germanium source enables the formation of Si-containing films such as SiGe or SiGeC over mixed substrates. FIG. 3 illustrates the benefits obtained when using trisilane in the context of a preferred embodiment, but it will be recognized by those skilled in the art that variations of the preferred method in accordance with the teachings herein will provide similar benefits. FIG. 3A illustrates a preferred structure 300 having field isolation regions 310 over a semiconductor substrate 320. In the illustrated embodiment, the semiconductor substrate 320 comprises epitaxial silicon formed over a single-crystal wafer and the isolation regions 310 are silicon dioxide. Prior to deposition, the substrate 320 is prepared for epitaxial deposition by methods known to those skilled in the art to expose an active area 340 having an oxide-free crystalline surface (epitaxial silicon) and an amorphous surface 330.

A gas comprising hydrogen (carrier gas) and a mixture of trisilane and germane is delivered to the oxide surface 330 and active area surface 340 under CVD conditions. In an alternate embodiment (not shown in FIG. 3), the gas is delivered to the surface of a buffer layer previously deposited over the oxide surface 330 and the active area surface 340 as described above. The weight ratio of trisilane to germane in the gas is about 15:1. The substrate 300 is preferably contained in a CVD chamber and the trisilane is preferably introduced to the chamber by bubbling the carrier gas through a temperature-controlled bubbler containing liquid trisilane. The deposition temperature is about 600° C. and deposition is continued for a period of time effective to deposit a mixed-morphology SiGe film 350 having an average thickness of about 2500 Å. A region 360 of the SiGe film 350 over the amorphous surface 330 has a non-epitaxial (e.g., polycrystalline or amorphous) morphology, whereas a region 370 over the single-crystal surface 340 has an epitaxial morphology.

An additional Si-containing cap layer can be deposited onto the Si-containing layer. Preferably, the deposition of the cap layer is carried out using trisilane in the manner described herein for the deposition of Si-containing films. For example, in the embodiment illustrated in FIG. 3C, a boron-doped silicon cap layer 380 is deposited onto the film 350 using a gas mixture comprising trisilane and diborane (about 100 parts per million (ppm), based on total) at a deposition temperature of about 600° C. In the illustrated embodiment, use of trisilane to deposit the cap layer 380 is advantageous because the SiGe film 350 is a mixed substrate comprising a mixed-morphology SiGe film. Preferably, the morphology of the cap layer 380 is single crystal over the epitaxially deposited region 370 and non-single crystal over the non-single crystal regions 360.

The composition and thickness of the deposited Si-containing film is preferably relatively uniform. More preferably, the silicon content varies throughout the volume of the film by about 20% or less, more preferably by about 10% or less, most preferably by about 2% or less, based on the average composition. Film composition is preferably determined using Secondary Ion Mass Spectrometry (SIMS). For example, in the illustrated embodiment, the SiGe film 350 has a silicon content of about 88% in the non-epitaxial region 360 over the amorphous surface 330 and a silicon content of about 92% in the epitaxial region 370 over the single-crystal surface 340. Thus, as compared to the average silicon content in the SiGe film 350 of about 90%, the silicon content in the illustrated embodiment varies throughout the volume of the film by about 2%. Preferably, the thickness of the deposited film varies across the surface of the film by about 50% or less, more preferably by about 25% or less, most preferably by about 10% or less, based on the average thickness. Film thickness is preferably determined by cross-sectioning a sample of the film and measuring the thickness by electron microscopy. For example, in the illustrated embodiment, the film 350 has a thickness of about 2400 Å in the region 360 over the amorphous surface 330 and a thickness of about 2600 Å in the region 370 over the single-crystal surface 340. Thus, as compared to the average film thickness for the film 350 of 2500 Å, the thickness in the illustrated embodiment varies across the surface of the film by about 4% (±100 Å), based on the average thickness.

Figure 4:
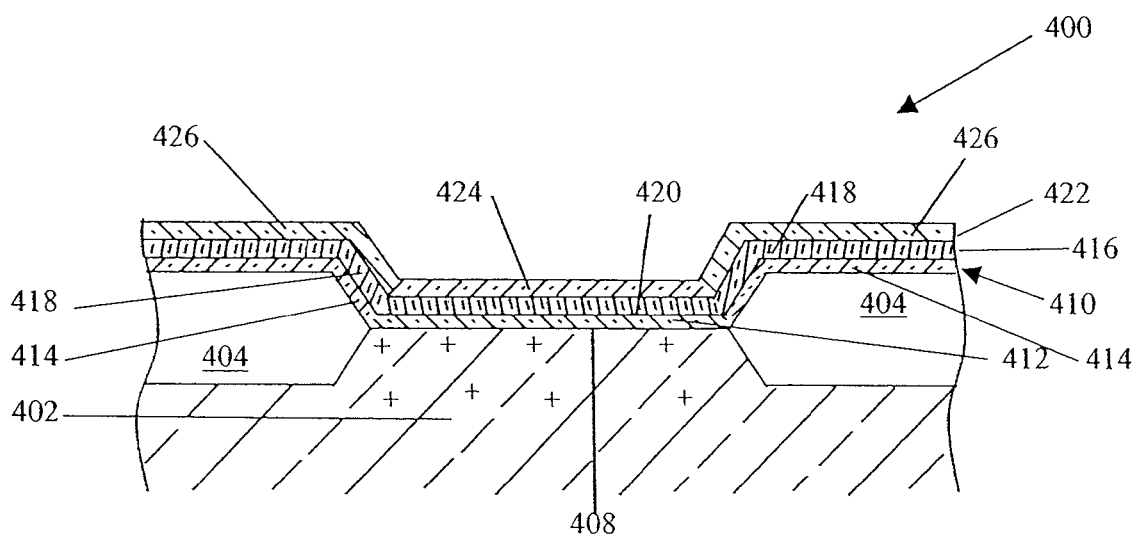
FIG. 4 illustrates a SiGe base structure for a BiCMOS HBT, constructed in accordance with a preferred embodiment.

Reference is now made to FIG. 4 to describe a preferred method for making a base structure for a SiGe heterojunction bipolar transistor ("SiGe HBT"), but it will be understood by those skilled in the art that the illustrated method is also applicable to other processes. Structure 400 in FIG. 4 is made by depositing a series of films onto a single-crystal silicon n+ substrate 402 having amorphous field isolation regions 404. The field isolation regions 404 are preferably silicon dioxide, but can be other dielectric materials, such as silicon nitride. Prior to deposition, the surface 408 of the substrate 402 is treated in a manner known to those skilled in the art to render it suitable for subsequent epitaxial deposition. Since the substrate 402 is n-doped, preferably with arsenic, the illustrated embodiment is suitable for npn transistors. However, those skilled in the art will recognize that the described methods are equally applicable to the fabrication of pnp devices.

A first-deposited film 410 is an optional buffer layer that is preferably deposited over the single crystal surface 408 and field isolation regions 404 using trisilane at a deposition temperature in the range of about 580° C. to about 700° C. to a preferred thickness of about 500 Å or less. The buffer layer is optionally n-doped using a dopant precursor, preferably in situ. In they illustrated embodiment, the buffer layer 410 is a 50 Å arsenic-doped mixed morphology film having an epitaxial region 412 over the single-crystal surface 408 and polycrystalline regions 414 over the field isolation regions 404. It is deposited by CVD using trisilane and a small amount of trisilylarsine as a dopant precursor at a deposition temperature of about 600° C. The buffer layer 410 is used to facilitate subsequent deposition during fabrication and the epitaxial region 412 functions as part of the collector in the resulting device.

A second film 416 is a p+ SiGe layer that is deposited onto the buffer layer 410 using a mixture of trisilane and a germanium source with a small amount of p dopant precursor, preferably by CVD at a temperature in the range of about 580° C. to about 700° C. The SiGe film 416 has an epitaxial region 420 over the single-crystal surface 408 and polycrystalline or amorphous regions 418 over the field isolation regions 404, corresponding to the immediately underlying epitaxial region 412 and the non-epitaxial regions 414 of the silicon buffer layer 410, respectively. The buffer layer 410 (if used) more preferably has a thickness of about 100 Å or less and facilitates simultaneous deposition of the epitaxial region 420 and the polycrystalline or amorphous regions 418 without a separate masking step. Preferably, the SiGe layer 416 contains about $1 \times 10^{16}$ to about $5 \times 10^{22}$ atoms/cm$^3$ of a p dopant. Boron is a preferred p dopant and diborane is a preferred dopant precursor.

The epitaxial region 420 of the SiGe layer 416 is a heteroepitaxial layer and accordingly is compressively strained, i.e., it has a bulk lattice constant that does not exactly match that of the underlying epitaxial silicon region 412. To provide increased device performance, it is usually advantageous to have a relatively high germanium content in the SiGe layer. However, greater amounts of germanium increase the amount of strain. As the thickness of the SiGe layer increases above a certain thickness, called the critical thickness, the formation of misfit dislocations at the film/substrate interface becomes energetically favorable. Such dislocations lead to reduced carrier mobility, current leakage, reduced device performance and even device failure.

For example, SiGe containing about 10% germanium has a critical thickness of about 300 Å for an equilibrium (stable) strained film and about 2,000 Å for a metastable, strained film on Si<100>. When the SiGe layer is thinner than about 500 Å, higher concentrations of germanium can be utilized because they can be incorporated without causing the formation of misfit dislocations. For a germanium content of about 50%, the critical thickness is about 100 Å for a metastable, compressively strained film on Si<100>. When the SiGe layer is thicker than about 1,000 Å, lower concentrations of germanium are typically preferred in order to reduce the risk of device malfunction due to formation of misfit dislocations. The SiGe layer 416 preferably contains germanium in an amount in the range of from about 5 atomic % to about 50 atomic %, more preferably about 10 atomic % to about 30 atomic %, and the thickness is preferably in the range of about 100 Å to about 1,500 Å. The germanium concentration and thickness are preferably adjusted in concert to produce a strained structure while avoiding misfit dislocations in the as-deposited structures.

In the illustrated embodiment, the epitaxial region 420 of the SiGe layer 416 is compressively strained. The epitaxial region 420 of the SiGe layer 416 contains about 10 atomic % germanium and about $1\times10^{19}$ atoms/cm$^3$ of boron, and is deposited using trisilane and germane (about 15:1 by volume, respectively) with a small amount of diborane as dopant precursor. The resulting boron-doped SiGe layer 416 is a mixed morphology film having a thickness of about 1,000 Å. The epitaxial region 420 of the SiGe layer 416 functions as a base in the resulting device.

A third film 422 is a doped silicon cap layer that is deposited onto the film 416 by CVD using trisilane and, optionally, a small amount of a p dopant precursor at a deposition temperature in the range of about 580° C. to about 650° C. The resulting p-doped cap layer 422 preferably has a thickness in the range of about 300 Å to about 1,000 Å. The film 422 is also a mixed morphology film having an epitaxial region 424 over the single-crystal surface 408 and polycrystalline regions 426 over the field isolation regions 404. In the illustrated embodiment, the film 422 is doped with boron using diborane as an in situ dopant precursor to achieve a dopant level in the range of about $1\times10^{17}$ to about $1\times10^{20}$ atoms/cm$^3$. It is deposited at a deposition temperature of about 600° C. and has a thickness of about 500 Å.

The cap layer 422 helps to maintain the metastable strain of the SiGe layer during subsequent processing steps and facilitates the formation of the emitter-base junction at the desired depth within the structure. When trisilane is used as the silicon source, greater compositional uniformity across the surface of the substrate is preferably achieved. Thus, the amount of p dopant in the polycrystalline regions 418 and 426 is preferably about the same as the level of p dopant in the epitaxial base region 420. Additional layers, e.g., an emitter, may be deposited onto the structure shown in FIG. 4 to produce the completed device, in a manner known to those skilled in the art. Subsequent electrical connection (not shown) to the epitaxial base region 420 is preferably made via contacts extending through overlying insulating layers to one or more of the doped polycrystalline regions 418 and 426.

It is apparent from the foregoing that the number of steps in a semiconductor manufacturing process can be advantageously reduced by replacing a conventional silicon source with trisilane. For example, the step of depositing a buffer layer 414 can be omitted when trisilane is used to deposit SiGe directly onto both surfaces instead of a silicon source such as silane, disilane, dichlorosilane, trichlorosilane or tetrachlorosilane. Moreover, with or without the buffer layer 414 of the preferred embodiments, trisilane facilitates deposition over heterogeneous surfaces in one step; in contrast, the use of a conventional silicon source in a process (see FIG. 5 below and attending description) typically involves separate steps of depositing a Si-containing film over the field isolation regions and the active area windows, masking, etching, and then later depositing the epitaxial base layer. The separate steps for depositing a Si-containing film over field isolation regions can be eliminated by replacing the conventional silicon source with trisilane and depositing the silicon-containing film 416 onto the single-crystal surface 408 and the non-epitaxial material 404 in the same step.

Thus, in a preferred embodiment, a method is provided for reducing the number of steps in a semiconductor device manufacturing process. Preferably, this method comprises identifying a semiconductor device manufacturing process that comprises depositing a first silicon-containing film onto a first surface using a first silicon source and, in a separate step, depositing a second silicon-containing film onto a second surface using a second silicon source, wherein the surfaces are different. The preferred method further comprises modifying the identified semiconductor device manufacturing process by replacing the first and second silicon sources with trisilane and depositing a silicon-containing film onto the first surface and the second surface in the same step. Preferably, the first and/or second silicon source is silane, the first surface is a single-crystal surface, and the second surface is amorphous or polycrystalline.

Figure 5A:
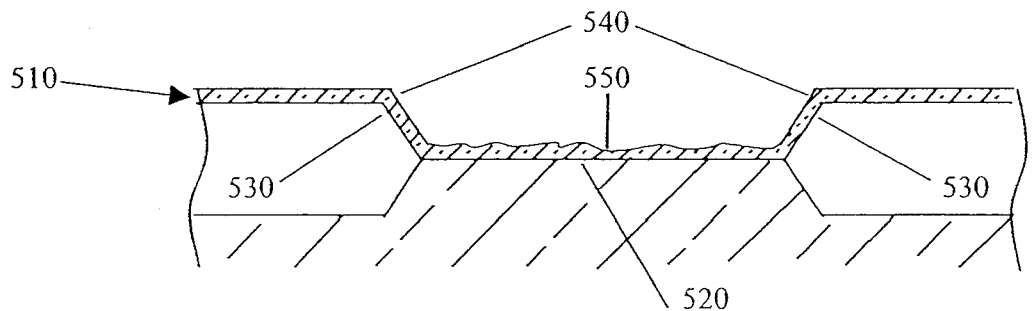
FIGS. 5A to 5D illustrate an alternative process flow for depositing a Si-containing film onto a mixed substrate.

In a preferred embodiment, the semiconductor device manufacturing process is modified by eliminating a masking step. Masking steps are conventionally employed to obtain deposition over heterogeneous surfaces. For example, in the process flow illustrated in FIG. 5, a polycrystalline film 510 in FIG. 5A is deposited over a mixed substrate comprising a single-crystal surface 520 and non-epitaxial surfaces 530 using a first silicon source such as silane, disilane, dichlorosilane, trichlorosilane or silicon tetrachloride. Due to generally poor nucleation over the oxide surfaces, extended deposition eventually results in a continuous and acceptably uniform thickness, which extended process results in excessive deposition over the active area window 520. Accordingly, region 550 must be masked, etched and replaced with a separate deposition. The deposition temperature is selected to deposit a film having a desired non-epitaxial (e.g., polycrystalline) morphology in the regions 540 over the non-epitaxial surfaces 530. These deposition conditions also tend to produce a polycrystalline morphology in the region 550 over the single-crystal surface 520, since the process flow calls for etching in this region.

Figure 5B:
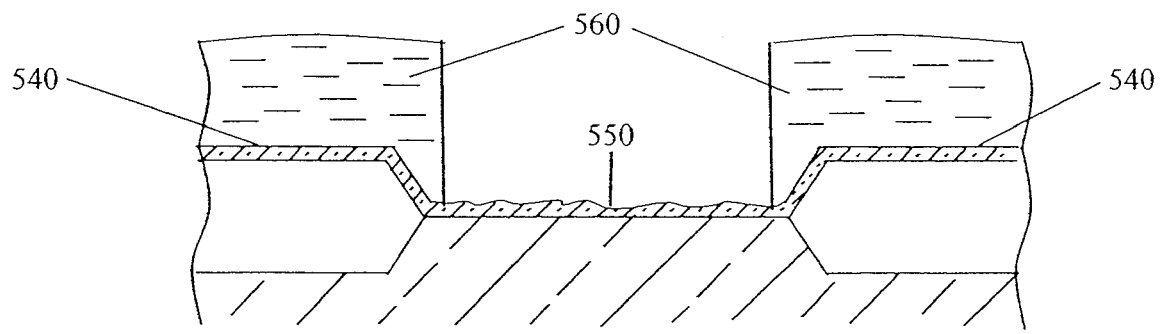
Figure 5C:
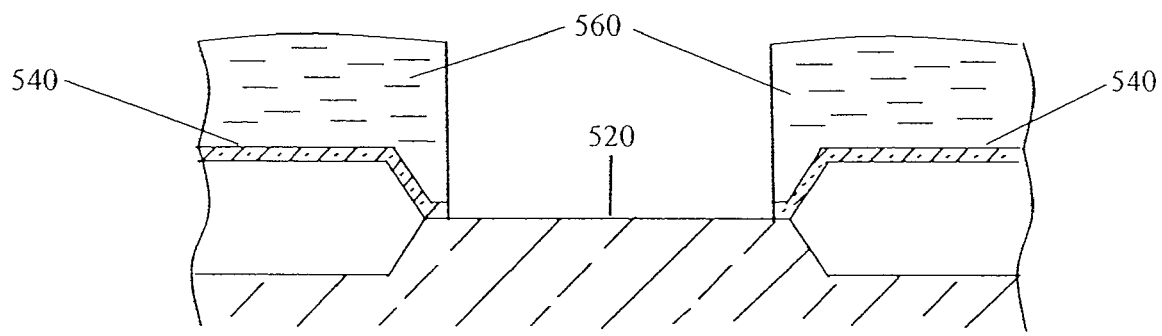
Figure 5D:
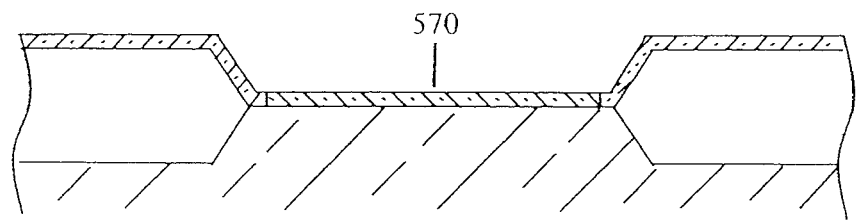
Figure 6:
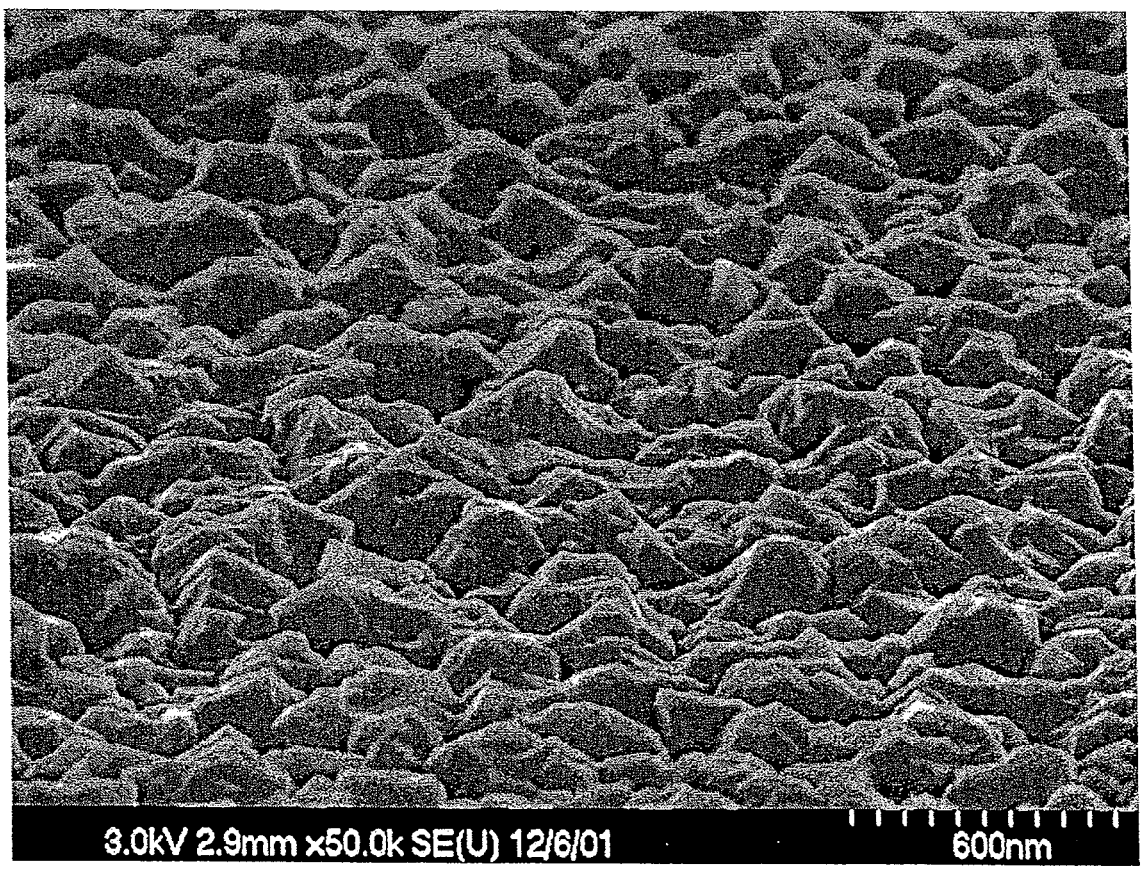
FIG. 6 is a reproduction of a scanning electron photomicrograph illustrating a SiGe film deposited using silane and germane.
Figure 7:
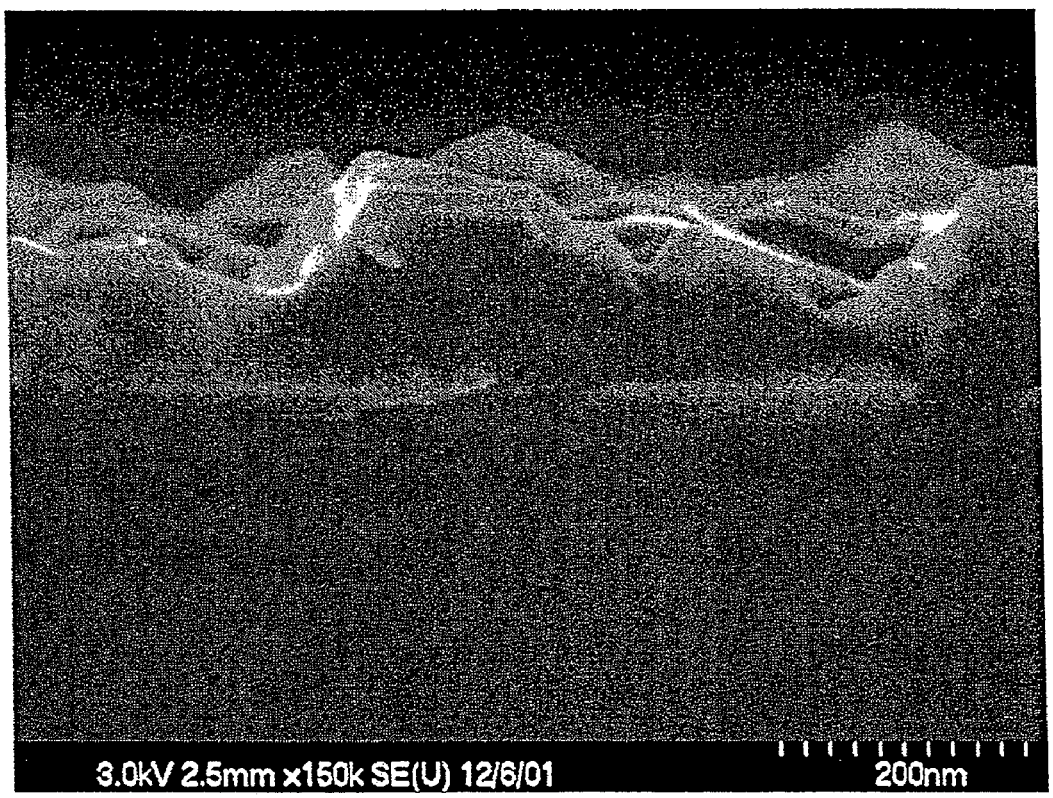
FIG. 7 is a reproduction of a scanning electron photomicrograph illustrating a cross section of the SiGe film shown in FIG. 6.
Figure 8:
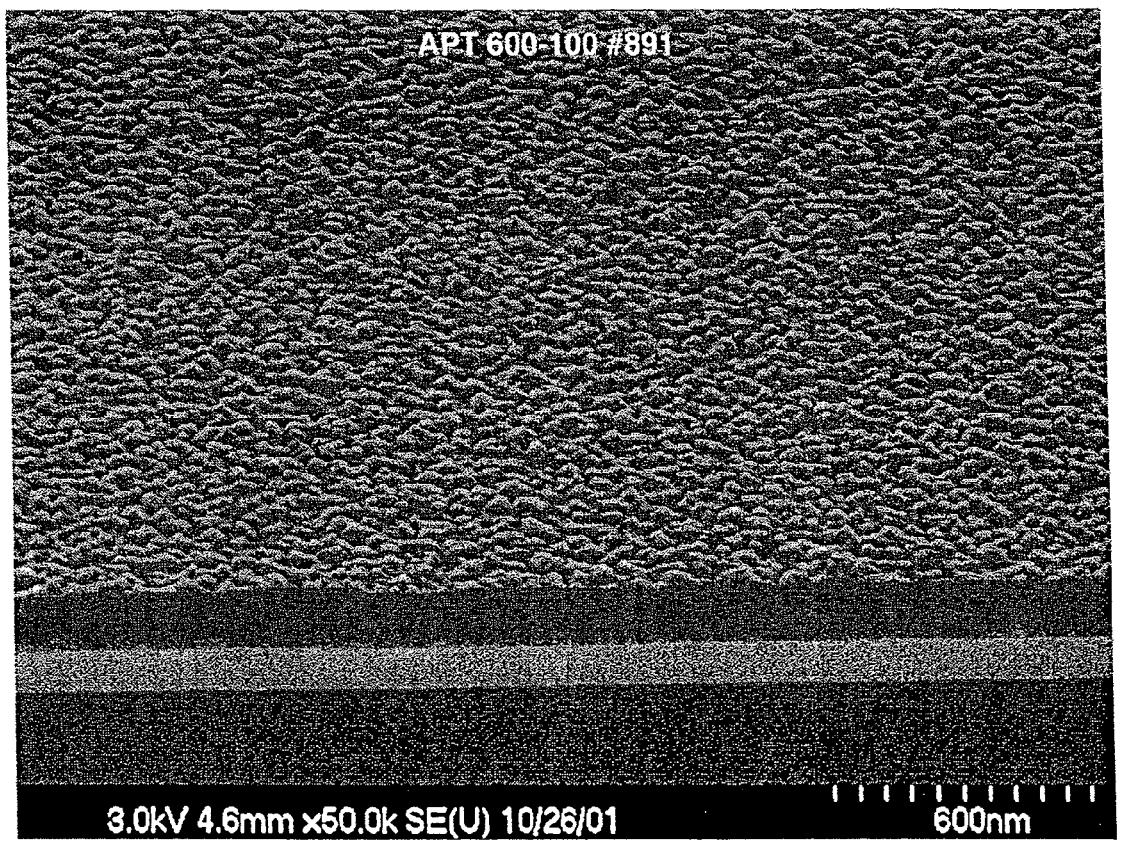
FIG. 8 is a reproduction of a scanning electron photomicrograph showing a SiGe film deposited using trisilane and germane, in accordance with a preferred embodiment.
Figure 9:
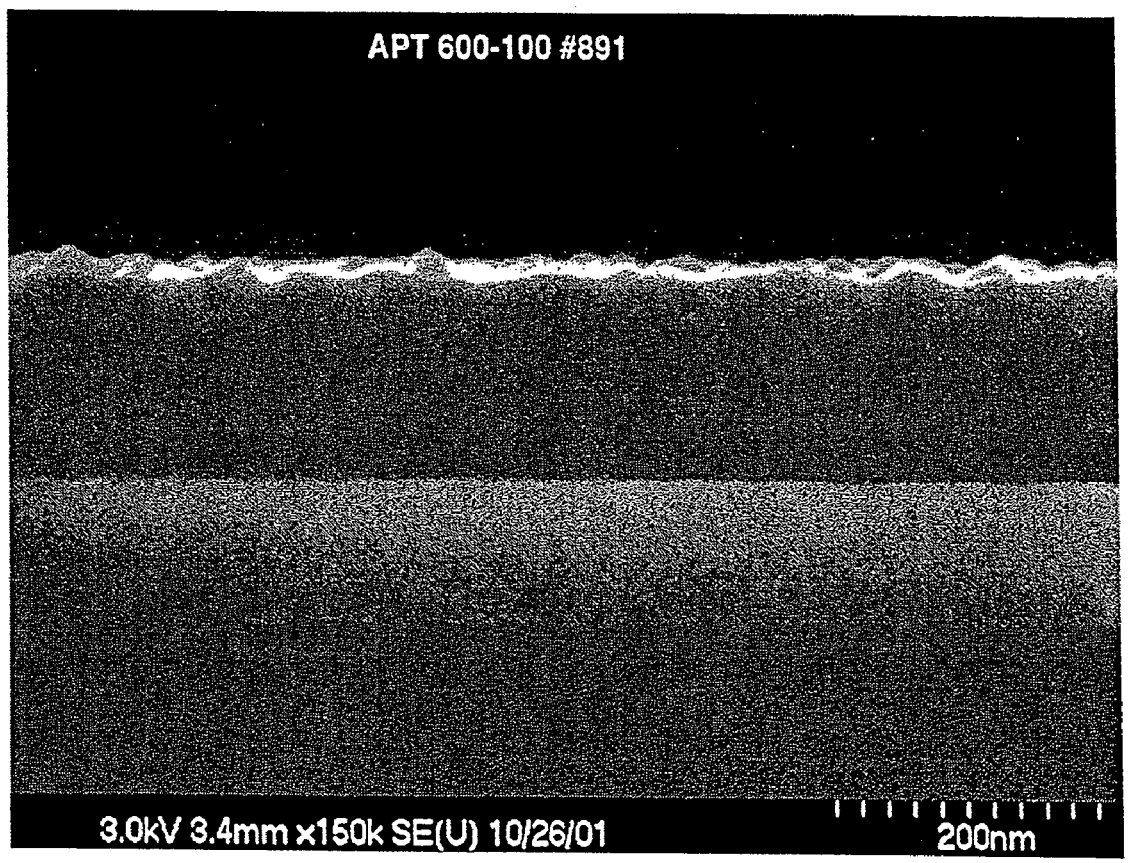
FIG. 9 is a reproduction of a scanning electron photomicrograph showing a cross section of the SiGe film shown in FIG. 8.

A series of masking and etching steps are used to replace the undesired polycrystalline morphology in the region 550 with the desired epitaxial morphology. Using known photolithography techniques, a photoresist mask 560 is formed and patterned as illustrated in FIG. 5B. The exposed Si-containing layer in the region 550 is then etched away as illustrated in FIG. 5C using known etching techniques, opening a window to expose the underlying single-crystal surface 520. During the etching, the photoresist mask 560 protects the underlying polysilicon regions 540, which later serve to make contact with the base region being formed in the window 520. The photoresist mask 560 is then removed and a deposition process using a second (possibly the same) silicon source deposits an acceptable epitaxial film 570 onto the single-crystal surface 520 as illustrated in FIG. 5D. Such conventional deposition processes are known in the art, as discussed above with respect to FIG. 1B.

Figure 3B:
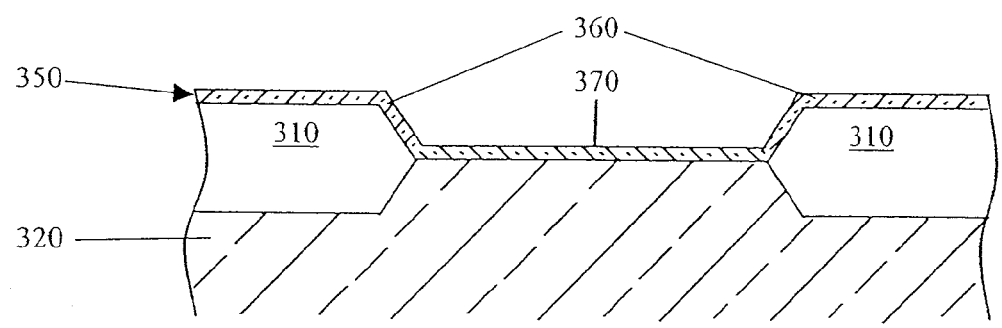
Figure 3C:
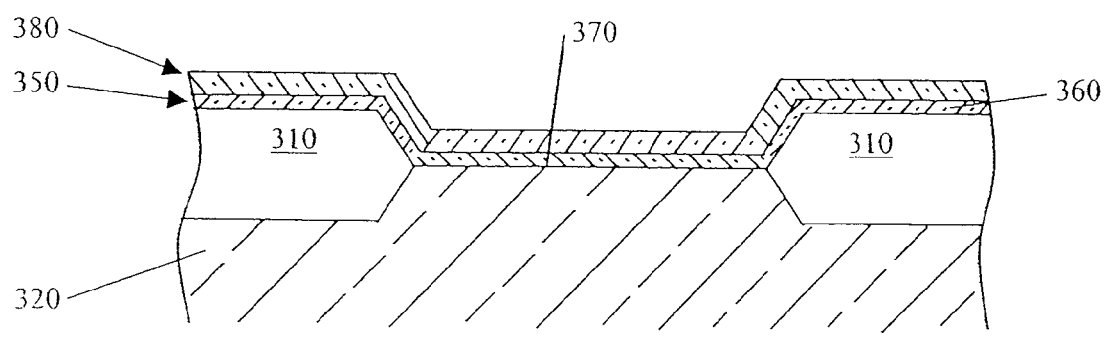

The processes of the preferred embodiments involve the use of trisilane to deposit a Si-containing film over both surfaces of a mixed substrate in a single step, thus eliminating masking, etching, and separate deposition steps of FIG. 5 to be more like the process flow of FIG. 4. The structure shown in FIG. 3B is illustrative of the preferred embodiments and may be produced in a single step by modifying the process flow illustrated in FIG. 5. This modification is preferably practiced by replacing a silicon source such as silane with trisilane and depositing the Si-containing film over both surfaces in a single step as illustrated in FIG. 3.

EXAMPLE 1

A substrate was provided consisting of a 1500 Å SiO$_2$ ("oxide") coating deposited onto a Si(100) wafer. The substrate was patterned to remove about 20% of the oxide coating to expose the underlying Si(100) wafer, thus creating a mixed substrate having a single-crystal surface and an amorphous oxide surface. The mixed substrate was then etched in a solution of dilute hydrofluoric acid, rinsed and dried. The mixed substrate was then loaded into an Epsilon E2500™ reactor system and subjected to a hydrogen bake at 900° C. at atmospheric pressure under a flow of 80 slm of ultra-pure hydrogen for 2 minutes. The mixed substrate was then allowed to reach thermal equilibrium at 600° C. at 40 Torr pressure under a flow of 20 slm of ultra-pure hydrogen gas. The steps of etching, drying, rinsing, and baking rendered the single crystal surface active for epitaxial film growth.

Pure hydrogen gas was then passed through liquid trisilane (maintained at room temperature using a water bath around the bubbler containing the trisilane) in order to deliver trisilane vapor to the heated substrate. The hydrogen/trisilane mixture, along with a flow of 90 sccm (inject) of trisilylarsine (100 ppm, 90 sccm mixed with 2 slm ultra-pure hydrogen) and 20 slm ultra-pure hydrogen, was then introduced into the reactor at a flow rate of 90 sccm for 15 seconds. A continuous, arsenic-doped, amorphous silicon film having a thickness of about 50 Å was deposited on the exposed oxide. A high crystal quality, arsenic-doped epitaxial silicon film having a thickness of about 45 Å was simultaneously deposited on the exposed Si<100> active areas. The trisilylarsine flow was then terminated. This deposition served as a buffer layer.

A graded-germanium concentration, boron doped film was then deposited in several sequential, uninterrupted steps using a trisilane/hydrogen flow rate of 25 sccm. First, germane (1.5% in ultra-pure $H_2$) was introduced into the reactor using a flow ramped from 0 sccm to 30 sccm over 45 seconds. Second, the germane flow was held constant at 30 sccm for 30 seconds. Third, the flow was changed to 20 sccm for 30 seconds. Fourth, the flow was changed to 15 sccm for 10 seconds while a flow of 90 sccm (inject) of diborane (100 ppm, 90 sccm mixed with 2 slm ultra-pure hydrogen) was also introduced into the reactor. Fifth, the diborane flow was held constant and the germane flow was reduced to 10 sccm for 30 seconds. A continuous, smooth, highly uniform amorphous silicon germanium film, partially doped with boron, having a total thickness of 1,000 Å was deposited on the amorphous silicon layer deposited in the first step. A high crystal quality, heteroepitaxial SiGe film having a total thickness of 1,100 Å, partially doped with boron, was deposited on the epitaxial silicon film deposited in the first step.

A boron-doped silicon cap layer was then deposited by maintaining the diborane flow, terminating the germane flow and increasing the trisilane/hydrogen flow rate to 90 sccm for 150 seconds. A continuous, smooth, boron-doped amorphous silicon film having a thickness of 490 Å was deposited on the amorphous SiGe layer deposited during the second deposition sequence. A high crystal quality, heteroepitaxial, boron-doped silicon film having a thickness of 475 Å was deposited on the heteroepitaxial SiGe layer deposited during the second deposition sequence. All of the film physical properties for all of the layers were highly uniform with respect to thickness and elemental concentration uniformity across the entire surface.

This example illustrates the use of trisilane in an isothermal, isobaric deposition process to deposit a Si(As)/SiGe(B)/Si(B) filmstack on a patterned dielectric substrate, similar to the structure shown in FIG. 4. Note that it was not necessary to mask/pattern the silicon buffer layer to deposit a high-quality filmstack over both types of surface. This represents a substantial savings in manufacturing costs for the deposition of this structure by virtue of the elimination of the process steps used to deposit and pattern the buffer layer, as well as an increase in throughput for the entire device manufacturing flow.

EXAMPLE 2 (COMPARATIVE)

A Si-containing film was deposited onto a $SiO_2$ substrate (without a nucleation layer) at a temperature of 600° C. using silane and germane as precursors. The surface roughness of the resulting SiGe film (as measured by atomic force microscopy) was 226 Å for a 10 micron×10 micron scan area. Scanning electron microscopy (SEM) of the SiGe film revealed pyramidal, faceted grains indicative of an island-type deposition, as demonstrated in the SEM micrographs shown in FIGS. 6 and 7. This island-type deposition shows that deposition proceeded by a process in which isolated nuclei first formed on the surface, then grew together to form the islands shown. This illustrates the sensitivity of deposition to surface morphology when silane is used, i.e., poor nucleation of silane-deposited layers on oxide and consequent roughness.

EXAMPLE 3

A Si-containing film was deposited at 600° C. as described in Example 2, but trisilane and germane were used in place of silane and germane as precursors. The surface roughness of the resulting SiGe film (as measured by atomic force microscopy) was 18.4 Å for a 10 micron×10 micron scan area. SEM of the SiGe film revealed a much more uniform surface, as demonstrated in the SEM micrographs shown in FIGS. 8 and 9 (same magnifications and tilt angles as FIGS. 6 and 7, respectively). The relative lack of island-type deposition, as compared to silane, shows that deposition occurred evenly over the surface, and did not proceed by the nucleation and growth mechanism described above in Example 2. This illustrates the relative insensitivity of deposition to surface morphology when trisilane is used, i.e., excellent nucleation of trisilane-deposited layers and consequent smoothness.

EXAMPLES 4-21

A series of Si-containing films were deposited onto a $SiO_2$ substrate (without a nucleation layer) at a pressure of 40 torr using trisilane and germane. The trisilane flow rate was constant at 77 sccm (hydrogen carrier, bubbler) for the examples of Table 1. Germane flow (10% germane, 90% $H_2$) and deposition temperature were varied as shown in Table 1. Germanium concentration (atomic %) and thickness of the resulting SiGe films were determined by RBS, and surface roughness was determined by atomic force microscopy (AFM). The results shown in Table 1 demonstrate that highly uniform films can be prepared over a range of temperatures and flow rate conditions, particularly over a range of germane concentration, and further illustrate the relative insensitivity of deposition to surface morphology when trisilane is used.

TABLE 1

| No. | Temp. (° C.) | Germane Flow (sccm) | % Ge | Thickness (Å) | Deposition Rate (Å/min) | Roughness (Å) |
|---|---|---|---|---|---|---|
| 1 | 450 | 25 | 5.0 | 34* | 8.5 | 3.2 |
| 2 | 450 | 50 | 7.5 | 34* | 11 | 4.1 |
| 3 | 450 | 100 | 11 | 59* | 15 | 3.7 |
| 4 | 450 | 100 | 11 | 53* | 13 | nd |
| 5 | 500 | 25 | 6.0 | 190 | 63 | 7.8 |

TABLE 1-continued

| No. | Temp. (°C.) | Germane Flow (sccm) | % Ge | Thickness (Å) | Deposition Rate (Å/min) | Roughness (Å) |
| --- | --- | --- | --- | --- | --- | --- |
| 6 | 500 | 50 | 10 | 230 | 77 | 9.1 |
| 7 | 500 | 100 | 13.5 | 290 | 97 | 8.3 |
| 8 | 500 | 100 | 13.5 | 380* | 127 | 7.2 |
| 9 | 550 | 25 | 6.0 | 630 | 315 | 5.2 |
| 10 | 550 | 50 | 9.5 | 670 | 335 | 13.6 |
| 11 | 550 | 100 | 14 | 900 | 450 | 12.1 |
| 12 | 550 | 100 | 14 | 1016 | 508 | 9.4 |
| 13 | 600 | 25 | 7.0 | 1160 | 580 | 8.1 |
| 14 | 600 | 50 | 13 | 1230 | 615 | 25.7 |
| 15 | 600 | 100 | 19 | 1685 | 843 | 31.8 |
| 16 | 650 | 25 | 11 | 630 | 630 | 23.3 |
| 17 | 650 | 50 | 17 | 800 | 800 | 31.5 |
| 18 | 650 | 100 | 27 | 1050 | 1050 | 50.2 |
| 19 | 700 | 25 | 11 | 680 | 680 | 18.1 |
| 20 | 700 | 50 | 18 | 835 | 835 | 37.8 |
| 21 | 700 | 100 | 31 | 960 | 960 | 44.9 |

*Thickness measured by optical technique
nd: not determined

It will be appreciated by those skilled in the art that various omissions, additions and variations may be made to the compositions and processes described above without departing from the scope of the invention, and all such modifications and changes are intended to fall within the scope of the invention, as defined by the appended claims.

I claim:

1. A method of reducing the number of steps in a semiconductor device manufacturing process, comprising:
    identifying a semiconductor device manufacturing process that comprises:
        (a) depositing a first silicon-containing film onto a single-crystal surface and a non-epitaxial surface,
        (b) forming a mask over the non-epitaxial surface to protect the first silicon-containing film over the non-epitaxial surface,
        (c) etching the first silicon-containing film over the single-crystal surface to expose the single-crystal surface, and
        (d) depositing a second silicon-containing film onto the exposed single-crystal surface; and
    modifying the semiconductor device manufacturing process by eliminating steps (b), (c), and (d) to provide a modified process capable of depositing in a single step a silicon-containing film that is epitaxial on the single-crystal surface and non-epitaxial on the non-epitaxial surface.

2. The method of claim 1, wherein the modified process comprises using trisilane to deposit in a single step the epitaxial film on the single-crystal surface and the non-epitaxial film on the non-epitaxial surface.

3. The method of claim 2, wherein the modified process comprises using trisilane in place of a silicon source selected from the group consisting of silane, disilane, dichlorosilane, trichlorosilane and silicon tetrachloride.

4. The method of claim 3, wherein the modified process comprises using trisilane in place of silane.

5. The method of claim 1, wherein depositing the first silicon-containing film in the semiconductor device manufacturing process before it is modified comprises depositing a polycrystalline film over the single crystal surface and the non-epitaxial surface.

6. The method of claim 1, wherein the non-epitaxial surface is amorphous.

7. The method of claim 1, wherein the non-epitaxial surface is polycrystalline.

8. A method of reducing the number of steps in a semiconductor device manufacturing process, comprising:
    identifying a semiconductor device manufacturing process, wherein the semiconductor device manufacturing process comprises
        (a) depositing a first silicon-containing film onto a non-epitaxial surface and onto a single-crystal surface using a first silicon source, forming a mask over the non-epitaxial surface, after depositing the first silicon-containing film to protect the first silicon-containing film over the non-epitaxial surface; and etching the first silicon-containing film over the single-crystal surface to expose the single-crystal surface, prior to depositing the second silicon-containing film and, in a separate step,
        (b) depositing a second silicon-containing film onto the single-crystal surface using a second silicon source; wherein the first silicon source and the second silicon source are each individually selected from the group consisting of silane, disilane, dichlorosilane, trichlorosilane and silicon tetrachloride; and
    modifying the semiconductor device manufacturing process to form a modified process, the modified process comprising using trisilane in place of the first silicon source and the second silicon source, wherein the trisilane is capable of depositing a third silicon-containing film onto the single-crystal surface and the non-epitaxial surface in a single step.

9. A method of reducing the number of steps in a semiconductor device manufacturing process, comprising:
    identifying a semiconductor device manufacturing process, wherein the semiconductor device manufacturing process comprises (a) depositing a first silicon-containing film onto a non-epitaxial surface using a first silicon source and, in a separate step, (b) depositing a second silicon-containing film onto a single-crystal surface using a second silicon source; wherein the first silicon source and the second silicon source are silane; and
    modifying the semiconductor device manufacturing process to form a modified process, the modified process comprising using trisilane in place of the first silicon source and the second silicon source, wherein the trisilane is capable of depositing a third silicon-containing film onto the single-crystal surface and the non-epitaxial surface in a single step.

10. The method of claim 8, wherein the modifying of the semiconductor device manufacturing process comprises eliminating the steps of forming the mask and etching.

11. The method of claim 8, wherein the first silicon-containing film comprises a polycrystalline morphology.

* * * * *